United States Patent
Byun

(10) Patent No.: US 7,292,499 B2
(45) Date of Patent: Nov. 6, 2007

(54) SEMICONDUCTOR DEVICE INCLUDING DUTY CYCLE CORRECTION CIRCUIT

(75) Inventor: Gyung-su Byun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 247 days.

(21) Appl. No.: 10/758,539

(22) Filed: Jan. 16, 2004

(65) Prior Publication Data
US 2004/0145963 A1 Jul. 29, 2004

(30) Foreign Application Priority Data
Jan. 17, 2003 (KR) .................. 10-2003-0003295

(51) Int. Cl.
*G11C 8/00* (2006.01)
(52) U.S. Cl. .................. 365/233; 365/149; 365/206
(58) Field of Classification Search .................. 365/233
See application file for complete search history.

(56) References Cited

U.S. PATENT DOCUMENTS

| | | | | |
|---|---|---|---|---|
| 5,614,855 A | * | 3/1997 | Lee et al. .................. | 327/158 |
| 5,845,862 A | * | 12/1998 | Cipriani .................. | 242/423.1 |
| 6,320,438 B1 | * | 11/2001 | Arcus .................. | 327/175 |
| 6,342,800 B1 | * | 1/2002 | Stark et al. .................. | 327/170 |
| 6,570,944 B2 | * | 5/2003 | Best et al. .................. | 375/355 |
| 6,643,790 B1 | * | 11/2003 | Yu et al. .................. | 713/500 |
| 2004/0075462 A1 | * | 4/2004 | Kizer et al. .................. | 326/29 |

FOREIGN PATENT DOCUMENTS

| | | | |
|---|---|---|---|
| KR | 1020000043233 A | | 7/2000 |
| WO | PCT WO 01/71915 A2 | | 9/2001 |

* cited by examiner

*Primary Examiner*—Thong Q. Le
(74) *Attorney, Agent, or Firm*—Volentine & Whitt, PLLC

(57) ABSTRACT

A duty cycle correction (DCC) circuit receives first and second clock signals and outputs a duty cycle adjusted clock signal, and a control circuit detects a process variation and controls respective slew rates of the first and second clock signals based on the detected process variation. The DCC circuit may include a first inverter having an input that receives the first clock signal, a second inverter having an input that receives the second clock signal, a third inverter having an input commonly connected to outputs of the first and second inverters, a first variable capacitor connected between the input of the first inverter and a ground voltage, and a second variable capacitor connected between the input of the first inverter and the ground voltage. In this case, the respective capacitance values of the first and second variable capacitors are set by the control circuit.

15 Claims, 4 Drawing Sheets

SEMICONDUCTOR DEVICE INCLUDING DUTY CYCLE CORRECTION CIRCUIT

BACKGROUND OF THE INVENTION

1. Field of the Invention

The present invention relates to a synchronous semiconductor memory device, and more particularly, the present invention relates to a synchronous semiconductor memory device including a duty cycle correction (DCC) circuit for correcting the duty cycle of a clock.

A claim of priority is made to Korean Patent Application No. 2003-3295, filed on 17 Jan. 2003, in the Korean Intellectual Property Office, the disclosure of which is incorporated herein in its entirety by reference.

2. Description of the Related Art

In a synchronous semiconductor memory device that receives/outputs data in phase with an internal clock, the duty cycle of the internal clock is a factor that affects operational characteristics of the device. The duty cycle of a clock is defined as the ratio of the pulse width to the pulse duration of the clock.

In general, most digital clock applications, such as those used in the field of semiconductor integrated circuits, rely on clock duty cycles of 50%. A clock with a duty cycle of 50% is a clock in which high-level and low-level durations of each pulse of the clock are the same.

It is often necessary to precisely control the duty cycle of a clock. For example, in the case of a synchronous semiconductor memory device that outputs data in phase with a clock, the output data may be distorted if the clock duty cycle is not precisely adjusted to 50%. Accordingly, a duty cycle correction (DCC) circuit is used when necessary to adjust an input clock having duty cycle that is above or below 50% to obtain a clock signal having a duty cycle of 50%.

In the meantime, double data rate (DDR) synchronous semiconductor memory devices have been developed in an effort to increase operating speeds. The DDR allows data to be input or output at both rising and falling edges of a clock. Accordingly, precise adjustment of the clock duty cycle is especially important in the case of DDR synchronous semiconductor memory devices.

FIG. 1 illustrates a conventional scheme of correcting the duty cycle of an input clock signal CLK_IN. As shown in FIG. 1, the input clock signal CLK_IN is input to a DCC circuit 12 via an amplifier 11. The DCC circuit 12 corrects the duty cycle of the input clock signal CLK_IN and outputs an output signal CLK_OUT as the result of the correction.

Here, the amplifier 11 amplifies the voltage levels of the input CLK_IN to obtain an amplitude swing between a ground voltage VSS and a power supply voltage VDD.

FIG. 2 is a circuit diagram of the DCC circuit 12 of FIG. 1. Referring to FIG. 2, the DCC circuit 12 includes first through third inverters 210, 220, and 230. The first inverter 210 includes a PMOS transistor MP21 and an NMOS transistor MN22, and the second inverter 220 includes a PMOS transistor MP23 and an NMOS transistor MN24.

The first inverter 210 receives and inverts an input first clock signal CLK_A, and outputs the inverted result to a node N. The second inverter 220 receives and inverts an input second clock signal CLK_B, which is opposite in phase to the first clock signal CLK_A, and outputs the inverted result to the same node N. That is, the output terminal of the first inverter 210 and the output terminal of the second inverter 220 are both connected to the node N. The third inverter 230 inverts a signal received from the node N and outputs the inverted result as an output signal CLK_OUT. The output signal CLK_OUT is a clock signal having a corrected duty cycle.

However, process variations in the fabrication of semiconductor memory device may cause distortion in the duty cycle of the output clock signal. As previously mentioned, the signal CLK_IN output from the amplifier 11 is input directly to the DCC circuit 12 and the DCC circuit 12 corrects the duty cycle of the clock and outputs an output signal CLK_OUT as the result of the correction. Process variations can alter the slope of the signal CLK_IN output from the amplifier 11, and as a result, the signal CLK_IN output from the DCC circuit 12 can be distorted.

If the distortion of the duty cycle of a clock is beyond design margins that the system can handle, a fatal error may occur during the operation of the system.

SUMMARY OF THE INVENTION

According to an aspect of the present invention, there is provided a semiconductor device which includes a duty cycle correction (DCC) circuit that receives first and second clock signals and outputs a duty cycle adjusted clock signal, and a control circuit that detects a process variation and controls respective slew rates of the first and second clock signals based on the detected process variation.

It is preferable that the DCC circuit includes a first inverter having an input that receives the first clock signal, a second inverter having an input that receives the second clock signal, a third inverter having an input commonly connected to outputs of the first and second inverters, a first variable capacitor connected between the input of the first inverter and a ground voltage, and a second variable capacitor connected between the input of the first inverter and the ground voltage. In this case, the respective capacitance values of the first and second variable capacitors are set by the control circuit.

It is preferable that the control circuit includes a process variation detector that detects the process variation and outputs a voltage signal corresponding to the process variation, a differential amplifier that receives the signal output from the process variation detector and a reference signal, and amplifies a difference between the voltage signal and the reference signal, and an analog-to-digital converter (ADC) that converts a signal output from the differential amplifier into a digital signal. In the case, the digital signal output from the ADC is a control signal for controlling the capacitance values of the first and second capacitors.

The process variation detector preferably includes a plurality of series connected PMOS transistors that have gates connected to a ground voltage, and a plurality of series connected NMOS transistors that have gates connected to a reference supply voltage.

The phase of the first clock signal is preferably opposite to a phase of the second clock signal, and the device may further include an amplifying circuit that receives an external clock signal and outputs the first and second clock signals corresponding to the external clock.

The duty cycle adjusted clock signal is an internal clock signal of a synchronous semiconductor memory device, such as a double data rate (DDR) synchronous semiconductor memory device.

According to another aspect of the present invention, there is provided a semiconductor device which includes a first inverter having an input that receives a first clock signal, a second inverter having an input that receives a second clock signal which is opposite in phase to the first clock signal, a third inverter having an input commonly connected to outputs of the first and second inverters, a first capacitor unit having a plurality of capacitors that are selectively connected between the input of the first inverter and a ground voltage to define a first capacitance value between the first inverter and the ground voltage, a second capacitor unit having a plurality of capacitors that are selectively connected between the input of the second inverter and the ground voltage to define a second capacitance value between the second inverter and the ground voltage, and a control circuit that detects a process variation and controls respective slew rates of the first and second clock signals based on the detected process variation. The control circuit controls the respective slew rates of the first and second clock signals by adjusting the first and second capacitance values of the first and second capacitor units, respectively.

BRIEF DESCRIPTION OF THE DRAWINGS

The above and other aspects and advantages of the present invention will become more apparent from the detailed description that follows, with reference to the accompanying drawings, in which.

DETAILED DESCRIPTION OF THE PREFERRED EMBODIMENTS

Figure 1:
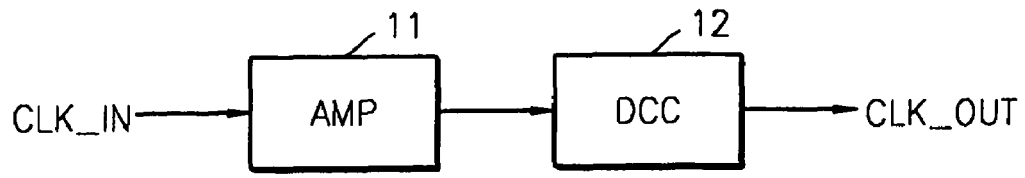
FIG. 1 illustrates a conventional scheme of correcting the duty cycle of an input clock.
Figure 2:
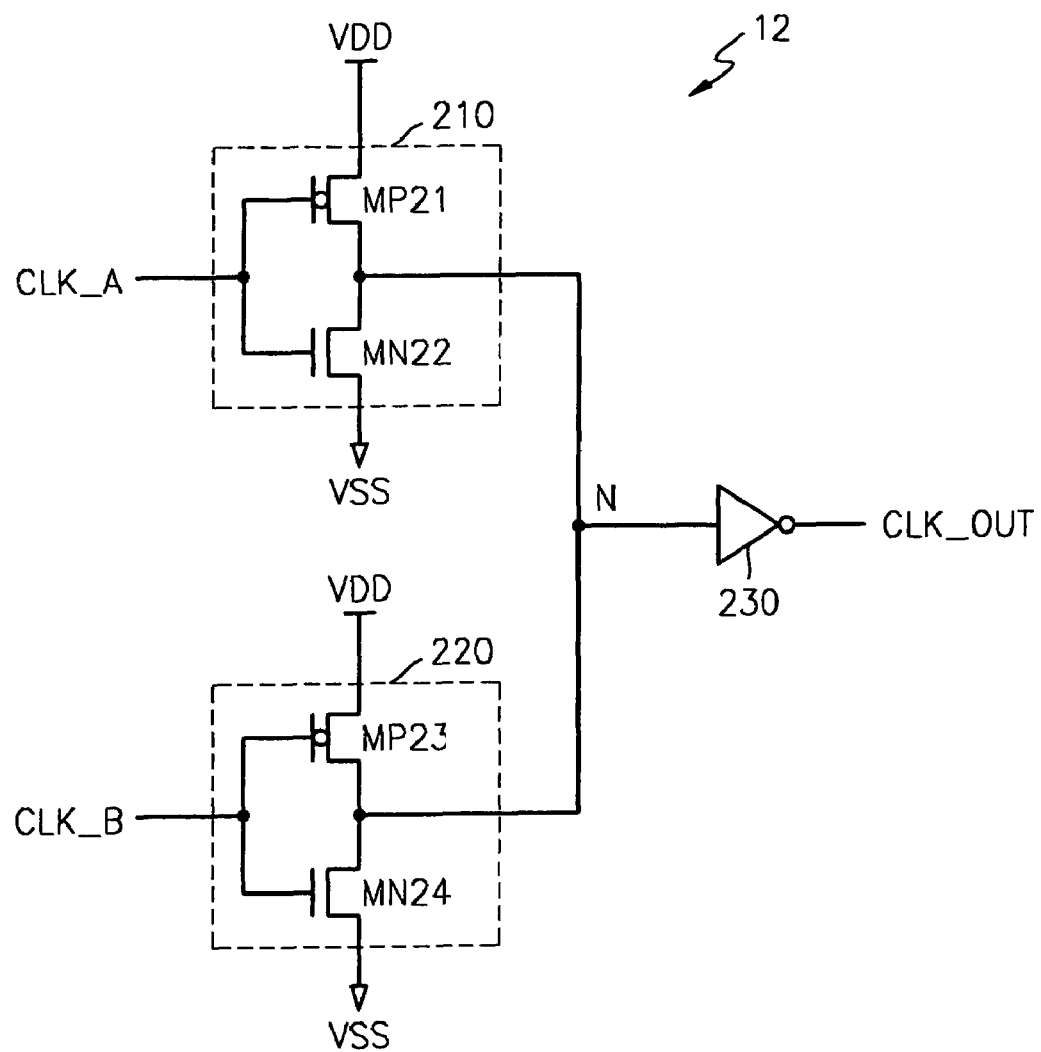
FIG. 2 is a circuit diagram of a duty cycle correction (DCC) circuit of FIG. 1.

Hereinafter, preferred embodiments of the present invention will be described in detail with reference the accompanying drawings. The same reference numerals represent the same elements throughout the drawings.

Figure 3:
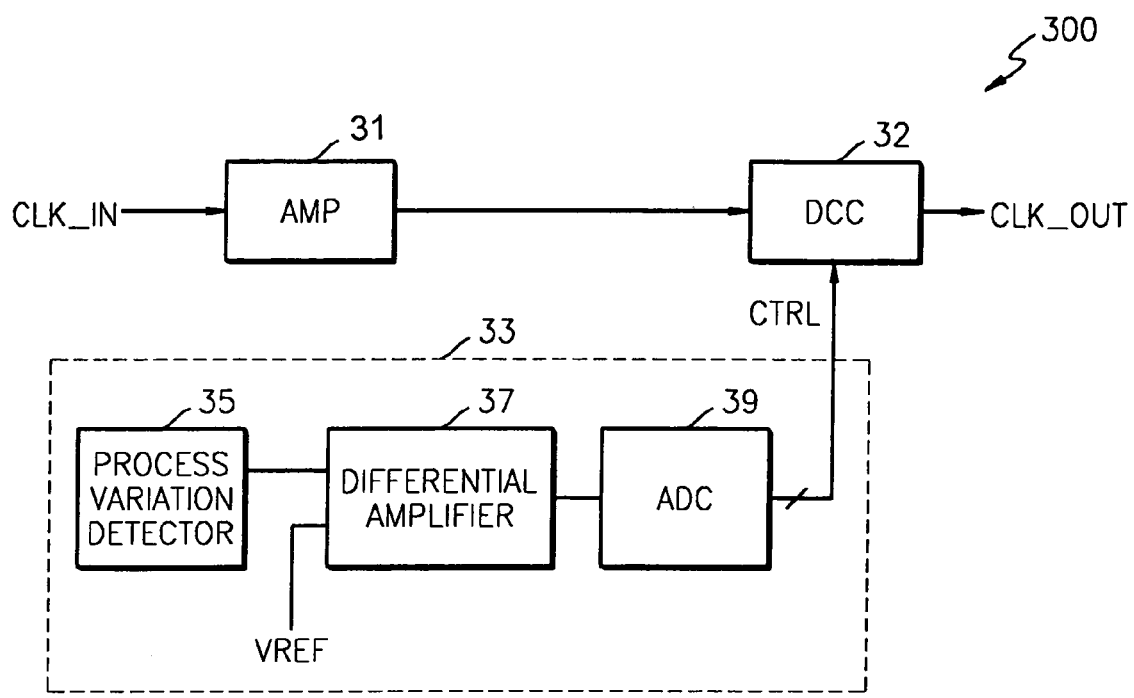
FIG. 3 is a block diagram of a semiconductor device that includes a circuit for correcting the duty cycle of a clock according to a preferred embodiment of the present invention.

FIG. 3 is a block diagram of a semiconductor device 300 that includes a circuit for correcting the duty cycle of a clock while compensating for process variations, according to a preferred embodiment of the present invention. For example, the device 300 may be contained in a synchronous semiconductor memory, such as a double data rate (DDR) synchronous semiconductor memory. Referring to FIG. 3, the semiconductor device 300 includes an amplifier 31, a duty cycle correction (DCC) circuit 32, and a control circuit 33.

The amplifier 31 receives an input clock signal CLK_IN, changes a voltage level of the input clock signal CLK_IN such that the signal has an amplitude swing between a ground voltage VSS and a power supply voltage VDD.

The DCC circuit 32 receives the amplified signal from the amplifier 31, corrects a duty cycle of the signal, and outputs an output signal CLK_OUT as the result of the correction.

The control circuit 33 includes a process variation detector 35, a differential amplifier 37 and an analog-to-digital converter (ADC) 39, and outputs a control signal CTRL which controls the slew rate of the clock signal output from the amplifier 31 based on a process variation exhibited by the semiconductor device 300.

The process variation detector 35 detects the process variation in the semiconductor device 300 and outputs the result of the detection. The differential amplifier 37 compares a signal output from the process variation detector 35 and a predetermined reference voltage VREF, amplifies a difference between the signal and the predetermined reference voltage VREF, and outputs the result of amplification. The ADC 39 receives a signal output from the differential amplifier 37 and outputs a digital signal corresponding to the received signal. The digital signal output from the ADC 39 is the control signal CTRL. The control signal CTRL is input to the DCC circuit 32 and adjusts the slope, i.e., slew rate, of the amplified clock signal output from the amplifier 31.

Hereinafter, a process that is performed faster than a typical process will be defined as a fast process, and a process that is performed more slowly than the typical process will be defined as a slow process. Also by definition, a semiconductor device that is fabricated using the typical process will allow for the correction of the clock duty cycle without the need to compensate for a process variation. On the other hand, a semiconductor device that is fabricated using the fast process or the slow process requires compensation for a process variation in order to obtain a clock having a correct duty cycle.

More specifically, if the semiconductor device is fabricated using the fast process, the slope of the amplified clock signal output from the amplifier 31 must be slightly adjusted, whereas if the semiconductor device is fabricated using the slow process, the slope of the amplified clock signal output from the amplifier 31 must be largely adjusted.

In FIG. 3, the reference voltage VREF is a predetermined voltage signal indicative of the typical process. The difference between the signal output from the process variation detector 35 and the predetermined reference voltage VREF is representative of the degree of process variation in the semiconductor device 300. The duty cycle of the clock signal can be precisely corrected by adjusting the slope of the amplified signal output from the amplifier 31 in accordance with the degree of process variation.

Figure 4:
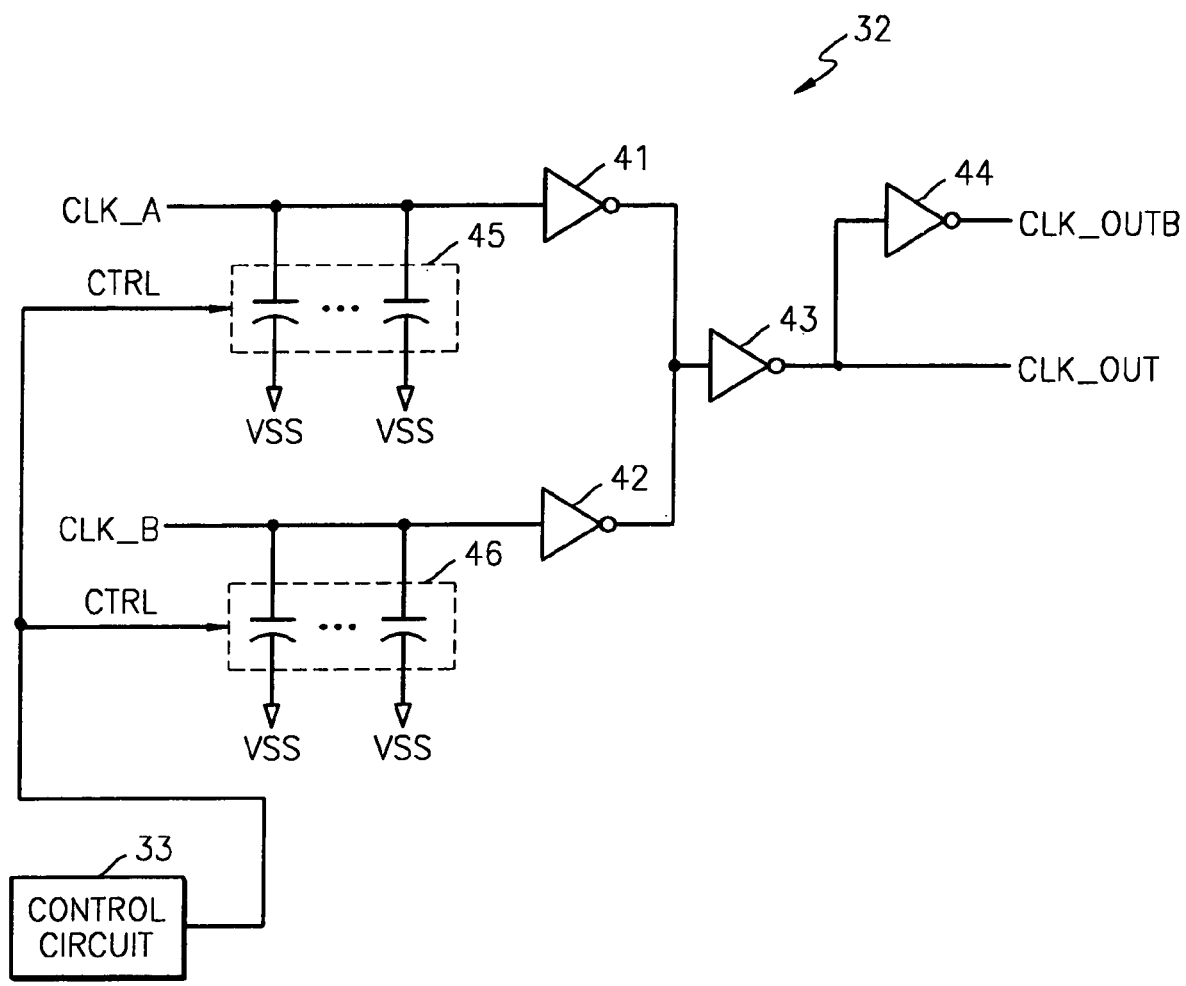
FIG. 4 is a circuit diagram of a DCC circuit of FIG. 3.

FIG. 4 is a circuit diagram of the DDC circuit 32 of FIG. 3. Referring to FIG. 4, the DCC circuit 32 includes first through fourth inverters 41, 42, 43, and 44, and first and second capacitor units 45 and 46. For convenience, connection of the control circuit 33 is also illustrated in FIG. 4.

The first inverter 41 receives and inverts a first clock signal CLK_A and outputs the inverted result. The second inverter 42 receives and inverts a second clock signal CLK_B, and outputs the inverted result. An output terminal of the first inverter 41 is connected to an output terminal of the second inverter 42. The third inverter 43 receives a signal output from the first inverter 41 and a signal output from the second inverter 42 and outputs an output clock signal CLK_OUT having a corrected duty cycle. The fourth inverter 44 inverts the output clock signal CLK_OUT output from the third inverter 43 and outputs an output clock signal CLK_OUTB also having a correct duty cycle.

The first capacitor unit 45 is connected between an input terminal of the first inverter 41 and a ground voltage VSS. The second capacitor unit 46 is connected between an input terminal of the second inverter 42 and the ground voltage VSS. A capacitance of the first capacitor unit 45 and a capacitance of the second capacitor unit 46 are variably set in response to the control signal CTRL output from the control circuit 33.

Each of the first and second capacitor units 45 and 46 of the DDC circuit 32 includes a plurality of capacitors. The capacitance of the first capacitor unit 45 is determined by selectively switching the capacitors of the first capacitor unit 45 on and off in response to the control signal CTRL. Likewise, the capacitance of the second capacitor unit 46 is determined by selectively switching the capacitors of the second capacitor unit 46 on and off in response to the control signal CTRL.

Assuming that the first capacitor unit 45 includes ten capacitors of 1 pF, only eight capacitors are switched on when the control signal CTRL is a first control signal, and only two capacitors are switched on when the control signal CTRL is a second control signal. In this case, the capacitance of the first capacitor unit 45 is 8 pF when the first control signal is input and is 2 pF when the second control signal is input. Whether the control signal CTRL is the first control signal or the second control signal is determined by the differential amplifier 37 shown in FIG. 3. The capacitance of the second capacitor unit 46 is variably set in the same way.

In the fast process, the control signal CTRL controls the capacitors of the first and second capacitor units 45 and 46 so as to increase their capacitances. In this case, the slope (slew rate) of the amplified clock signal output from the amplifier 11 decreases. In the slow process, the control signal CTRL controls the capacitors of the first and second capacitor units 45 and 46 to reduce their capacitances, and the slope of the amplified clock signal output from the amplifier 11 increases.

By controlling the capacitances of the first and second capacitor units 45 and 46, it is possible to precisely correct the slew rate of the amplified input clock, and thus the duty cycle of the output clock, notwithstanding the presence of a process variation.

The capacitances of the first and second capacitor units 45 and 46 are set in response to the control signal CTRL, but the construction of the first and second capacitor units 45 and 46 is not limited to the aforementioned structure having plural capacitors.

Figure 5:
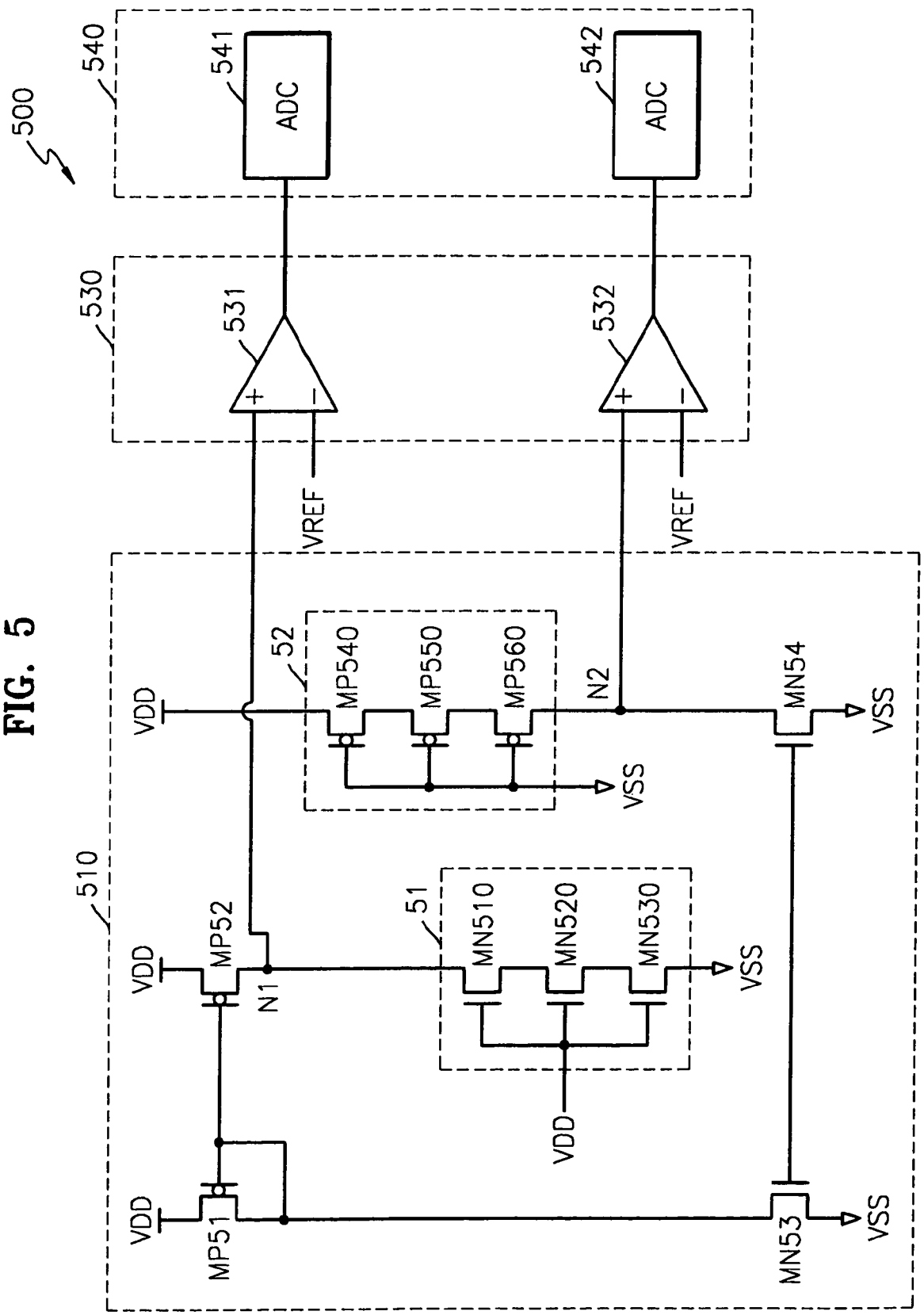
FIG. 5 is a circuit diagram of a control circuit according to a preferred embodiment of the present invention.

FIG. 5 is a circuit diagram of a control circuit 500 according to a preferred embodiment of the present invention. Referring to FIG. 5, the control circuit 500 includes a process variation detector 510, a differential amplifier unit 530, and an ADC unit 540. Unlike the control circuit 33 of FIG. 3, two signals are output from the ADC unit 540 of the control circuit 500, and thus, the control circuit 500 can detect process variations of both an NMOS transistor and a PMOS transistor.

The process variation detector 510 includes an NMOS process variation detector 51, a PMOS process variation detector 52, and a plurality of MOS transistors MP51, MP52, MN53, and MN54. The NMOS process variation detector 51 has a gate connected to a power supply voltage VDD and includes a plurality of NMOS transistors MN510, MN520, and MN530 that are connected in series. The PMOS process variation detector 52 has a gate connected to a ground voltage VSS and includes a plurality of PMOS transistors MP540, MP550, and MP560 that are connected to one another in series.

Gates of the PMOS transistors MP51 and MP52 are connected to each other. A source of the PMOS transistor MP51 is connected to the power supply voltage VDD and a drain of the PMOS transistor MP51 is connected both to a drain of the NMOS transistor MN53 and the gate of the PMOS transistor MP52. A source of the PMOS transistor MP52 is connected to the power supply voltage VDD and a drain of the PMOS transistor MP52 is connected to a drain of the NMOS transistor MN510 of the NMOS process variation detector 51.

Gates of the NMOS transistors MN53 and MN54 are connected to each other and their sources are connected to the ground voltage VSS. A drain of the NMOS transistor MN54 is connected to a drain of the PMOS transistor MP560 of the PMOS process variation detector 52.

The NMOS process variation detector 51 is connected between the drain of the PMOS transistor MP52 and the ground voltage VSS. The PMOS process variation detector 52 is connected between the power supply voltage VDD and the drain of the NMOS transistor MN54.

A drain terminal of the PMOS transistor MP52 inputs a signal output from the NMOS process variation detector 51 to a first differential amplifier 531, and a drain terminal of the NMOS transistor MN54 inputs a signal output from the PMOS process variation detector 52 to a second differential amplifier 532.

The differential amplifier unit 530 includes the first and second differential amplifiers 531 and 532, and amplifies a difference between an NMOS process variation output at node N1 and a reference voltage VREF, and a difference between a PMOS process variation output at node N2 and the reference voltage VREF.

The ADC unit 540 includes a first ADC 541 and a second ADC 542. The ADC unit 540 receives signals output from the first and second differential amplifiers 531 and 532 and converts these signals into digital control signals.

The MOS transistors MP51, MP52, MN53, and MN54 of the process variation detector 510 form a current mirror that acts as a reference current source.

The detection of process variations in the NMOS process variation detector 51 and the PMOS process variation detector 52 will now be described.

The sizes of the MOS transistors depend on a process variation, and accordingly, the amount of currents flowing through the MOS transistors or their turn-on resistances also depend on the process variation.

Returning to FIG. 5, all of the MOS transistors MN510, MN520, MN530, MP540, MP550, and MP560, which constitute the NMOS process variation detector 51 and the PMOS process variation detector 52, are turned on. Thus, turn-on resistances of the NMOS process variation detector 51 and the PMOS process variation detector 52 will be dependent on a process variation, and the voltages of output terminals N1 and N2 will also be dependent on a process variation.

For instance, in the case of the fast process, a large current flows through the NMOS process variation detector 51 and the PMOS process variation detector 52 and turn-on resistances of their transistors are reduced, thus applying high voltages to the output terminals N1 and N2. In contrast, during the slow process, low voltages are applied to the output terminals N1 and N2.

After detecting the process variation, the differential amplifier unit 530 receives the result of detection, measures a difference between the result of detection and the reference voltage VREF, amplifies the difference, and outputs the result of amplification. The ADC unit 540 converts signals output from the differential amplifier unit 530 into digital signals and generates control signals for controlling the capacitances of the first and second capacitor units 45 and 46 shown in FIG. 4.

As described above, a semiconductor memory device according to the present invention is capable of precisely correcting the duty cycle of a clock regardless of a process variation by adjusting the slope of an amplified clock signal input to a DCC circuit.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device which includes a plurality of MOS transistors, comprising:
   a duty cycle correction (DCC) circuit that receives first and second clock signals and outputs a duty cycle adjusted clock signal; and a control circuit that detects a process variation affecting an operating characteristic of the MOS transistors and controls respective slew rates of the first and second clock signals based on the detected process variation, wherein the control circuit controls the respective slew rates of the first and second clock signals by adjusting capacitance values of first and second input terminals receiving the first and second clock signals, respectively.

2. The device of claim 1, wherein a phase of the first clock signal is opposite to a phase of the second clock signal.

3. The device of claim 1, further comprising an amplifying circuit that receives an external clock signal and outputs the first and second clock signals corresponding to the external clock.

4. The device of claim 1, wherein the duty cycle adjusted clock signal is an internal clock signal of a synchronous semiconductor memory device.

5. The device of claim 1, wherein the process variation affects a size and turn-on resistance of the MOS transistors.

6. A semiconductor device, comprising:
a duty cycle correction (DCC) circuit that receives first and second clock signals and outputs a duty cycle adjusted clock signal; and
a control circuit that detects a process variation and controls respective slew rates of the first and second clock signals based on the detected process variation;
wherein the DCC circuit comprises:
a first inverter having an input that receives the first clock signal;
a second inverter having an input that receives the second clock signal;
a third inverter having an input commonly connected to outputs of the first and second inverters;
a first variable capacitor connected between the input of the first inverter and a ground voltage; and
a second variable capacitor connected between the input of the first inverter and the ground voltage,
wherein respective capacitance values of the first and second variable capacitors are set by the control circuit.

7. The device of claim 6, wherein the control circuit comprises:
a process variation detector that detects the process variation and outputs a voltage signal corresponding to the process variation;
a differential amplifier that receives the signal output from the process variation detector and a reference signal, and amplifies a difference between the voltage signal and the reference signal; and
an analog-to-digital converter (ADC) that converts a signal output from the differential amplifier into a digital signal,
wherein the digital signal output from the ADC is a control signal for controlling the capacitance values of the first and second capacitors.

8. The device of claim 7, wherein the process variation detector comprises a plurality of series connected PMOS transistors that have gates connected to a ground voltage, and wherein the output signal of the process variation detector is dependent upon the process variation.

9. The device of claim 7, wherein the process variation detector comprises a plurality of series connected NMOS transistors that have gates connected to a reference supply voltage, and wherein the output signal of the process variation detector is dependent upon the process variation.

10. A semiconductor device which includes a plurality of MOS transistors, comprising:
a duty cycle correction (DCC) circuit that receives first and second clock signals and outputs a duty cycle adjusted clock signal; and
a control circuit that detects a process variation affecting an operating characteristic of the MOS transistors and controls respective slew rates of the first and second clock signals based on the detected process variation;
wherein the duty cycle adjusted clock signal is an internal clock signal of a synchronous semiconductor memory device, and wherein the synchronous semiconductor memory device is a double data rate (DDR) synchronous semiconductor memory device.

11. The device of claim 10, wherein the process variation affects a size and turn-on resistance of the MOS transistors.

12. A synchronous semiconductor memory device comprising:
a first inverter having an input that receives a first clock signal;
a second inverter having an input that receives a second clock signal which is opposite in phase to the first clock signal;
a third inverter having an input commonly connected to outputs of the first and second inverters;
a first capacitor unit having a plurality of capacitors that are selectively connected between the input of the first inverter and a ground voltage to define a first capacitance value between the first inverter and the ground voltage;
a second capacitor unit having a plurality of capacitors that are selectively connected between the input of the second inverter and the ground voltage to define a second capacitance value between the second inverter and the ground voltage; and
a control circuit that detects a process variation and controls respective slew rates of the first and second clock signals based on the detected process variation,
wherein the control circuit controls the respective slew rates of the first and second clock signals by adjusting the first and second capacitance values of the first and second capacitor units, respectively.

13. The device of claim 12, wherein the control circuit comprises:
a process variation detector that detects the process variation and outputs a voltage signal corresponding to the process variation;
a differential amplifier that receives the signal output from the process variation detector and a reference signal, and amplifies a difference between the voltage signal and the reference signal; and
an analog-to-digital converter (ADC) that converts a signal output from the differential amplifier into a digital signal,
wherein the digital signal output from the ADC is a control signal for controlling the first and capacitance values of the first and second capacitor units, respectively.

14. The device of claim 12, wherein the duty cycle adjusted clock signal is an internal clock signal of a synchronous semiconductor memory device.

15. The device of claim 14, wherein the synchronous semiconductor memory device is a double data rate (DDR) synchronous semiconductor memory device.

* * * * *